United States Patent [19]

Kitano et al.

[11] Patent Number: 5,295,045
[45] Date of Patent: Mar. 15, 1994

[54] PLASTIC-MOLDED-TYPE SEMICONDUCTOR DEVICE AND PRODUCING METHOD THEREFOR

[75] Inventors: Makoto Kitano, Tsuchiura; Asao Nishimura, Ushiku; Akihiro Yaguchi; Nae Yoneda, both of Ibaraki; Maya Obata, Ishioka; Ryuji Kohno; Mitsuaki Haneda, both of Ibaraki, all of Japan

[73] Assignee: Hitachi, Ltd., Tokyo, Japan

[21] Appl. No.: 791,551

[22] Filed: Nov. 14, 1991

[30] Foreign Application Priority Data

Nov. 14, 1990 [JP] Japan .................. 2-306305

[51] Int. Cl.⁵ ............................................ H05K 5/02
[52] U.S. Cl. ........................................ 361/813; 361/760; 361/772; 361/773; 174/52.1; 174/52.2; 174/52.4; 174/261; 257/690; 257/784; 257/787
[58] Field of Search ............ 361/400, 404, 405, 406, 361/421, 760, 761, 772, 773, 774, 813; 174/52.2, 52.1, 52.4, 261; 257/690, 701, 787, 784

[56] References Cited

U.S. PATENT DOCUMENTS

| | | | |
|---|---|---|---|
| 5,014,113 | 5/1991 | Casto | 357/70 |
| 5,034,800 | 7/1991 | Marchisi | 357/72 |
| 5,049,527 | 9/1991 | Merrick et al. | 437/220 |
| 5,049,977 | 9/1991 | Sako | 357/72 |
| 5,064,968 | 11/1991 | Kovacs et al. | 174/52.4 |
| 5,101,324 | 3/1992 | Sato | 361/400 |
| 5,157,771 | 9/1992 | Hiroi et al. | 357/70 |
| 5,161,304 | 11/1992 | Queyssac et al. | 29/827 |
| 5,166,866 | 11/1992 | Kim et al. | 361/403 |

FOREIGN PATENT DOCUMENTS

| | | |
|---|---|---|
| 61-59862 | 3/1986 | Japan . |
| 62-8529 | 1/1987 | Japan . |
| 62-119952 | 6/1987 | Japan . |
| 62-131555 | 6/1987 | Japan . |
| 62-260352 | 11/1987 | Japan . |
| 62-293749 | 12/1987 | Japan . |
| 63-124450 | 5/1988 | Japan . |
| 63-220559 | 9/1988 | Japan . |
| 1-99248 | 4/1989 | Japan . |
| 1-220837 | 9/1989 | Japan . |
| 1-257361 | 10/1989 | Japan . |
| 1-295454 | 11/1989 | Japan . |
| 2-15660 | 1/1990 | Japan . |

*Primary Examiner*—Leo P. Picard
*Assistant Examiner*—Young Whang
*Attorney, Agent, or Firm*—Antonelli, Terry, Stout & Kraus

[57] ABSTRACT

A plastic-molded-type semiconductor device having a high degree of integration encases a plurality of semiconductor chips in a package unit with each chip situated perpendicular to the substrate for mounting. On a surface of each chip containing circuits or on a reverse surface of the same, a lead frame is attached with an insulating material interposed therebetween. The chip and lead frame are connected with each other by using wire. The lead frame is arranged perpendicularly to another lead frame provided in parallel and connected therewith by welding. A printed circuit board may be used in place of said latter lead frame. By arranging the chips in projections made of resin, the thermal resistance of the semiconductor device is decreased. The present invention is particularly effective for a memory IC.

48 Claims, 7 Drawing Sheets

PLASTIC-MOLDED-TYPE SEMICONDUCTOR DEVICE AND PRODUCING METHOD THEREFOR

BACKGROUND OF THE INVENTION

1. Field of the Invention

The present invention relates to a plastic-molded-type semiconductor device and a producing method therefor, and in particular, to a plastic-molded-type semiconductor device suitable to attain a higher level of device integration and a producing method therefor.

2. Description of the Prior Art

Encasing a plurality of semiconductor chips in a single packaged unit is directly effective in attaining a higher level of device integration.

It may not be so effective in attaining a higher level of device integration to arrange a plurality of semiconductor chips in a plane, because the outer size of the package becomes rather large. Therefore, it is required to pile a plurality of semiconductor chips one upon another in a package in order to achieve a high integration of the device.

There are disclosed several methods of piling a plurality of semiconductor chips one upon another in a package. One of the methods is to mount semiconductor chips on each side of a chips pad, as disclosed, for example, in Japanese Patent Application Laid-open No. 62-8529, No. 62-131555, No. 1-220837, or No. 1-257361.

A method of piling two semiconductor chips having different sizes one upon another is disclosed in Japanese Patent Application Laid-open No. 1-295454 or No. 2-15660.

Further, a structure, in which each of a plurality of semiconductor chips is mounted on each of a plurality of lead frames each composed of an outer lead and an inner lead, respectively, and these semiconductor chips are piled one upon another, as forming many layers, so as to seal them, is disclosed in Japanese Patent Application Laid-open No. 63-124450 or No. 63-220559.

Another method of piling a plurality of semiconductor chips and mounting them in one package unit, in which semiconductor chips are connected with lead frames using a special method, is disclosed in Japanese Patent Application Laid-open No. 61-59862 or No. 1-99248. Further another method, in which piled lead frames in many layers are electrically connected inside of the package to each other, is disclosed in Japanese Patent Application Laid-open No. 62-119952.

Further, Japanese Patent Application Laid-open No. 62-260352 or No. 62-293749 discloses a method of mounting a plurality of semiconductor chips on a substrate with each of the semiconductor chips arranged perpendicular to the substrate.

Among the above-mentioned methods of prior arts, the method of mounting semiconductor chips on both sides of a chip pad can not provide a high level integration more than two chips, because the number of semiconductor chips is essentially only two chips. In addition, it is difficult in this method to electrically connect the chips mounted on the both sides of the chip pad with the lead frames through electric wires.

The method of piling a plurality of chips having various sizes one upon another and mounting them thereon can not be adopted when a plurality of semiconductor chips each having the same size such as memory chips, for example, are to be mounted for achieving a high level integration. Further, when the height differences between the semiconductor chips and the lead frames are greater, there is caused a disadvantage that the wires are apt to contact with the corners of the semiconductor chips.

The method performed using a plurality of lead frames makes impossible a plastic-molding method utilizing a transfer-molding method, which is widely used at the present time, because several layers of outer leads project on the package surface form. Therefore, this method is unsuitable to a mass-production.

The method performed using a special method of electrically connecting the chips with the lead frames is difficult to be brought in practice, because the reliability of connection according to this method is judged insufficient when compared with the conventional connection through wires on the base of the data as far as disclosed in the known references.

The method of arranging semiconductor chips perpendicular to the chip pad adopts a special method for electrically connecting the chips with the substrate, and therefore, as mentioned above, is difficult to be brought in practice. These methods require to arrange the electrodes of the chips unevenly near one side of the device, thereby causing a disadvantage that the degree of design freedom for chips is decreased.

In the method of connecting a plurality of lead frames piled up in several layers with one another inside of the package unit, since the inside leads connected with the outside leads are arranged in parallel to the chips, the number of the semiconductor chips to be encased in a package unit is limited below three chips in the structure.

Further, the above known methods include a common disadvantage that no consideration is paid to the discharge of the heat, which is generated in a great amount when the number of chips increases, towards the outside of the package unit.

SUMMARY OF THE INVENTION

It is a principal object of the present invention to overcome the above-mentioned disadvantages of the prior arts and to attain a high level integration and a high reliability of a semiconductor device using a wire connection which is considered the most reliable at the present time to connection of chips and lead frame, and using a transfer-molding, which is suitable to a mass-production for encasing more than three semiconductor chips of various sizes in one package unit. It is other object of the present invention to maintain the temperature of the semiconductor chips at a low level by decreasing the thermal resistance of the package unit in accordance with increasing of heat generation quantity of the semiconductor chips caused by encasing a plurality of semiconductor chips in one package unit.

For achieving the above-mentioned objects, according to the present invention, a plurality of semiconductor chips are arranged substantially perpendicular to a substrate for mounting a semiconductor device thereon, and then, plastic-molded. Further, as made suitable to a mass-production, the leads are directly connected with the chips through electrical insulator.

In addition, heat radiating fins are formed of molding resin to be designed to decrease the thermal resistance, and the semiconductor chips are disposed inside of these fins.

A plastic-molded-type semiconductor device according to the present invention comprises a plurality of semiconductor chips, lead frames including an aggregate of an outer lead group and an inner lead group, and connecting members for electrically connecting the semiconductor chips with the lead frames, and forms a package unit by molding a part of the lead frames, the semiconductor chips, and the electrical connecting members by use of a resin.

The first characterizing feature of the present invention is to arrange a plurality of semiconductor chips in directions each intersecting a substrate to be mounted with these semiconductor chips. A typical method of arranging the group of semiconductor chips is to arrange the chips substantially perpendicular to the substrate and/or substantially perpendicular to the main plane of the second lead frame group, which will be described later.

The second characterizing feature is to connect the first lead frame group with the surface formed with a circuit of a plurality of semiconductor chips or on the reverse surface thereof through electrical insulators, respectively, and to connect the first lead frame group with the semiconductor chips using, for example, electric wires.

The third characterizing feature is to connect the end portions opposite to the above-mentioned connecting end portions of the first lead frame group with the second lead frame group, which is connected with an outside lead group.

In order to improve the above third feature, it may be also effective to provide an inside wiring board in the package unit, and to electrically connect the first lead frame group and the second lead frame group with this wiring board. This inside wiring board typically includes an electrical insulator, which is arranged substantially in parallel to the substrate for mounting the semiconductor device thereon, and a wiring pattern. It may be also effective to arrange an additional semiconductor chip substantially parallel to the substrate for mounting the semiconductor device thereon in place of the inside wiring board.

It is preferred that the second lead frame group has a lead frame group united with the outside lead and a lead frame group connected therewith.

In the above arrangements, the plurality of semiconductor chips may be composed totally of memory chips, or composed of memory chips and chips for controlling these memory chips.

In view of heat radiation, there is the post preferable form in which a plastic-molded projection is provided on the package surface opposite to the surface facing to the substrate for mounting the semiconductor device, and at least a part of the plurality of the semiconductor chips is buried inside of this projection. Further, it is preferred to provide a plurality of projections, and to bury a portion of the semiconductor chip in each of these projections.

A method of producing a semiconductor device according to the present invention comprises the steps of sticking an end portion of a first lead on a semiconductor chip with an insulator film disposed therebetween, wire-bonding the first lead to the semiconductor chip, electrically connecting the first lead with a second lead continuous to an outside lead and fixing them, then arranging the semiconductor chips substantially perpendicular to the substrate, and plastic-molding, the above-mentioned constituent members after those steps.

In this method, it is also effective to use an inside wiring plate or other semiconductor chip in place of the second lead or as a part of the second lead.

According to the present invention, a plurality of semiconductor chips are arranged on an inside lead group which is arranged in parallel to a substrate for mounting with a semiconductor device and continuously to an outside lead group, the semiconductor chips are sticked on an inside lead group different from the above-mentioned inside lead group, the latter inside lead group is connected with the chips by electric wires, and the different lead groups are connected with each other by means of welding or the like. As a result, it becomes possible to encase semiconductor chips of arbitrary size and arbitrary numbers together into one package unit, and to assure superior reliability and productivity obtained by applying conventional, widely used arts for connecting the constituent members with one another. Further, by arranging a semiconductor chip in a heat radiating plastic-molded fin, since the thickness of the resin between the semiconductor chip and the surface of the package unit is made thinner, it becomes possible to decrease the thermal resistance of the semiconductor device.

DETAILED DESCRIPTION OF THE PREFERRED EMBODIMENTS

Preferred embodiments of the present invention will be described as follows.

Figure 1:
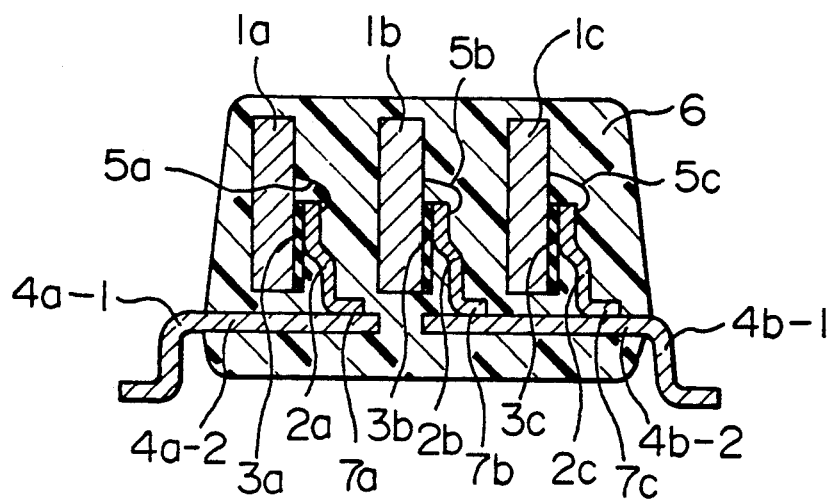
FIGS. 1 to 11 are secitonal views of plastic-molded-type semiconductor devices according to various embodiments of the present invention.
Figure 13:
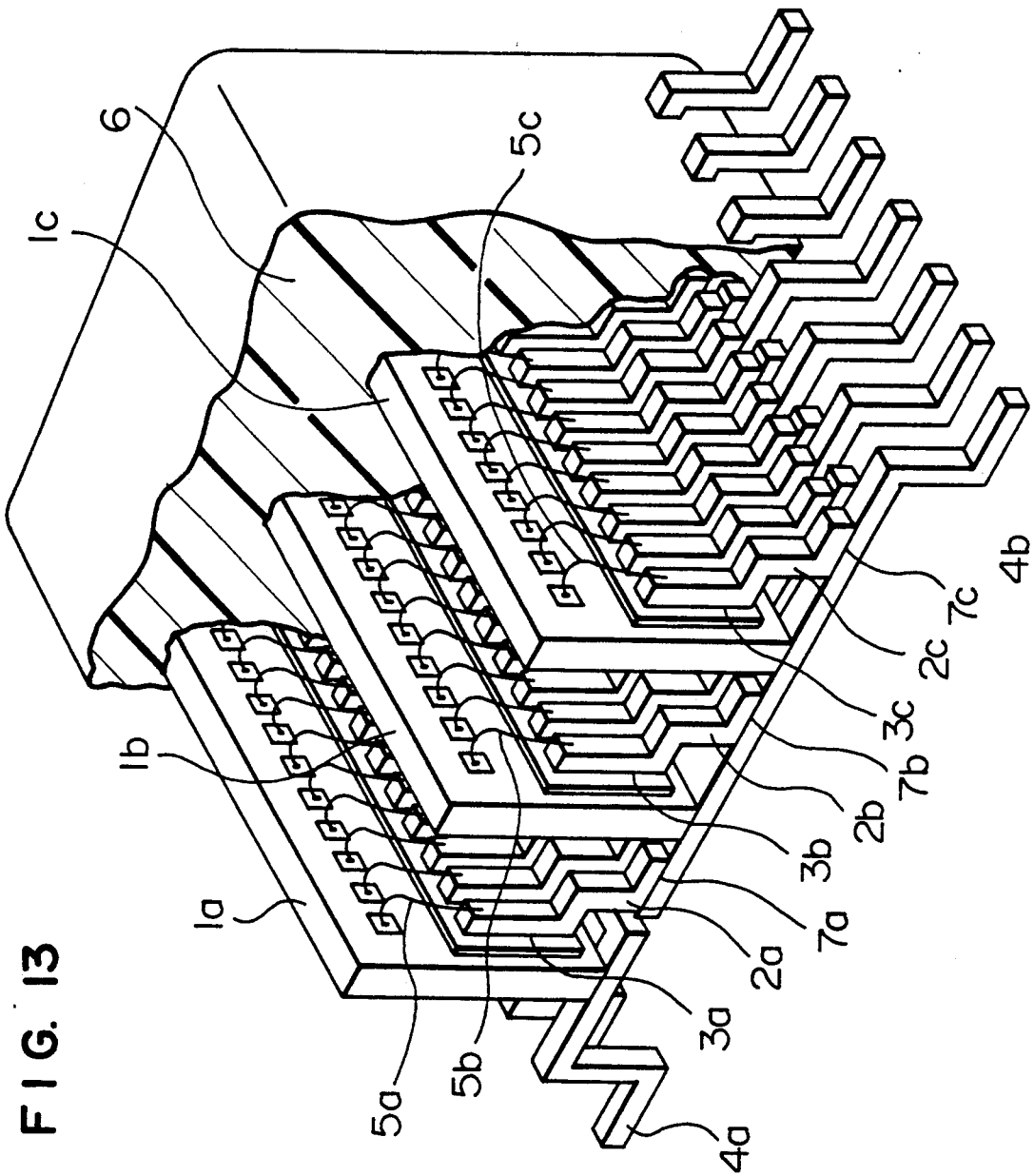
FIG. 13 is a partially cutaway perspective view of the first embodiment.

A plastic-molded-type semicoductor device according to the first embodiment of the present invention is shown in FIG. 13 in a perspective view, and in FIG. 1 in a sectional view. In FIG. 13, the resin is partly removed for showing the inside structure of the package unit.

In this embodiment, three semiconductor chips 1a, 1b and 1c are arranged perpendicular to a substrate for mounting this semiconductor device. On the circuit arranged surface of each semiconductor chips, a first lead frame group 2a, 2b an 2c is sticked with an electric insulating material 3a, 3b and 3c interposed therebetween, respectively, and the first lead frame group is electrically connected with each chip through wires 5a, 5b and 5c.

The end portions 7a, 7b and 7c of the first lead frame group are connected with the second lead frame group 4a-2, 4b-2, which are connected with the outside lead frames 4a-1, 4b-1. The members excluding the outside leads is enclosed by the resin 6.

Next, an example of a method of producing the semiconductor device according to this embodiment will be described. Firstly, a plurality of rows of common lead frames are used as the first lead frame group, on which plastic films are sticked by use of a plastic adhesive. The circuit formed surfaces of the semiconductor chips are sticked to each of the plastic films, and the first lead frame group is connected with the semiconductor chips through electric wires. The processes up to this point are quite the same as the production processes which have been already practiced for production of semiconductor device having a lead-on-chip structure.

Next, the lead frame group is cut, thereby preparing a required number of lead frames each bended with a right angle at its end portion. Then, a plurality of usual lead frames are used as the second lead frame group, and the previously prepared member composed of semiconductor chips and the first lead frames is disposed at a predetermined position of the second lead frame perpendicular to the same by use of suitable jigs, and the front ends of the first lead frame are connected with the second lead frame by welding. Thus, the assembled parts are plastic-molded by means of an usual transfer molding art, and the outside leads are formed by cutting and bending the second lead frame, thereby enabling a plastic-molded-type semiconductor device to produce as shown in FIG. 1.

As to the material used in this embodiment, copper or iron-nickel alloy is used for the lead frame groups, and the material of the first lead frame may be different from that of the second lead frame. A polyimid group resin is used for the insulating film. Gold or wire coated by an insulating material may be used for the wire. Epoxy resin including filler is used for the molding plastic. Laser beam welding is applied for welding the lead frames.

Although, in this embodiment, three chips are encased in one package unit, an arbitrary number of semiconductor chips can be encased in a package, and the size of each chip may be arbitrary.

In FIGS. 1, although the semiconductor chips 1b and 1c are both connected with the single lead 4b-2, the connecting configuration between each electrode of semiconductor chips and lead frames is determined according to the electric circuit design.

Further, a plurality of rows of semiconductor chips may be arranged perpendicular to the paper surface of FIG. 1. If, for example, in FIG. 1, two rows of semiconductor chips in which each row includes three chips and each chip is situated perpendicular to the paper surface are arranged, six semiconductor chips as a whole can be encased in one package unit.

As mentioned above, in this embodiment, an arbitrary number of semiconductor chips each having an arbitrary size can be accommodated in a single package unit by using usual materials and usual processes, and a high level integration of the semiconductor device can be obtained.

Figure 2:
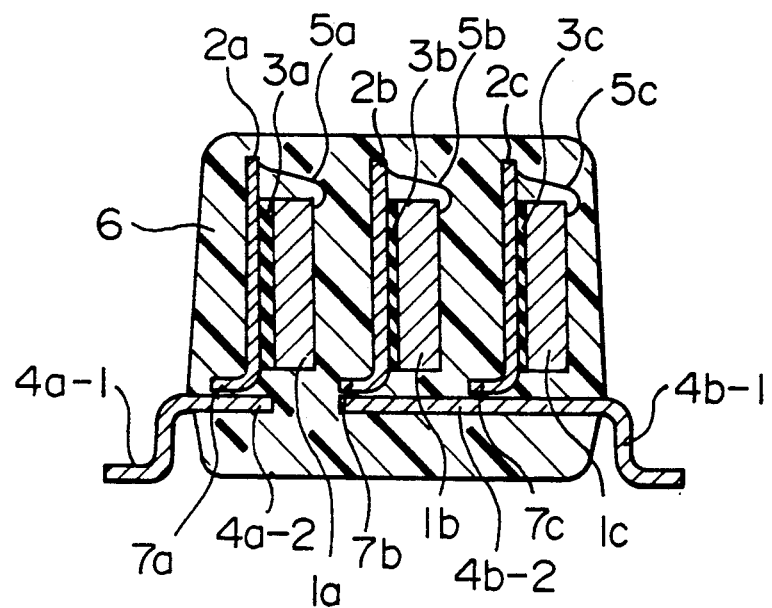

A second embodiment of the present invention is shown in FIG. 2 in a sectional view.

In this embodiment, three semiconductor chips 1a, 1b and 1c are arranged perpendicular to a substrate for mounting this semiconductor device thereon. On the reverse surface of the circuit arranged surface of each semiconductor chips the first lead frame group 2a, 2b and 2c is sticked with an electric insulating material 3a, 3b and 3c interposed therebetween, respectively, and the first lead frame group is electrically connected with each chip through wires 5a, 5b and 5c. The structures other than above are the same as in the first embodiment.

The producing method in this embodiment is the same as in the first embodiment. Namely, the chips are sticked to the lead frames with an insulating film interposed therebetween, and a required number of members composed of lead frames and semiconductor chips connected therewith are prepared and then connected with the second lead frame by welding.

This embodiment is especially effective in case of using such a chip that electrodes are arranged near the side of the chip.

Figure 3:
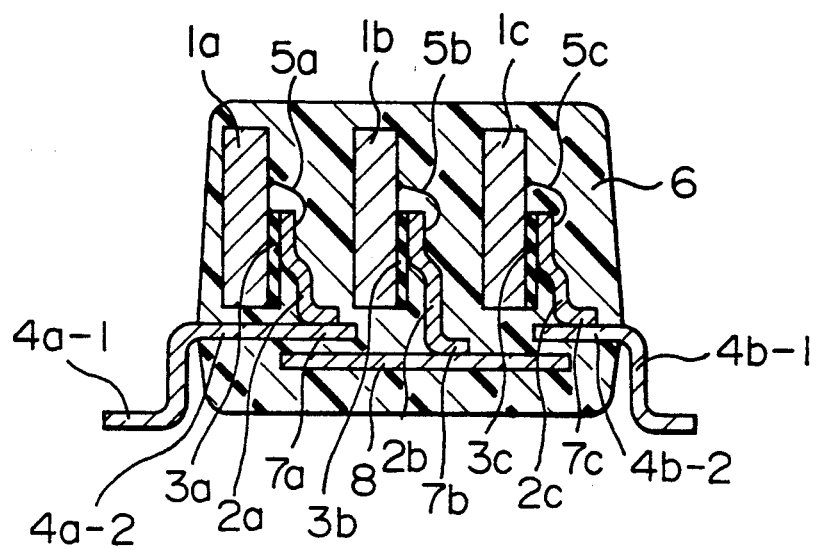

A third embodiment of the present invention is shown in FIG. 3 is a sectional view of a plastic-molded semiconductor device.

In this embodiment, the structure is the same as the first embodiment at the point that the structure includes chips, electrically insulating member, first lead frame, and wires, but is different in such a way that the first lead frame is connected with the second lead frame. In detail, the first lead frame 2b electrically connected with the central semiconductor chip 1b is welded to a part 8 of the second lead frame disposed below the first lead frame.

Figure 4:
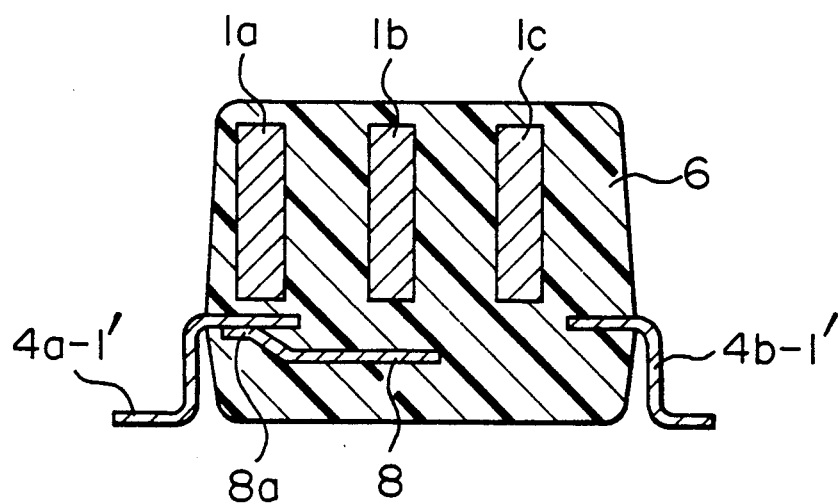

FIG. 4 shows a sectional view of another embodiment different from the third embodiment of FIG. 3.

A part 8 of the second lead frame is weled to the outside lead 4a-1' at its front end portion 8a. Therefore, an electrode in the semiconductor chip 1b connected with the wire 5b can be electrically connected with the outside lead 4a-1'.

As mentioned above, by making the second lead frames consist of lead frames united with outside leads and lead frames welded to the outside leads as forming a plurality of layers, it becomes possible to increase the degree of freedom of the electrical connection inside of the package unit.

Further, although, in this embodiment, the second lead frames form two layers, it is easily effected to increase the number of layers by connecting additional lead frame using such as welding. The connection between the lead frame 8 and the outside lead 4a-1' may be carried out at the same time as the connection between the first lead frame and the second lead frame, or it may be also possible to connect the lead frame 8 with the outside lead 4a-1' in advance, and after then, connect the first lead frame with the combined second lead frame.

Figure 5:
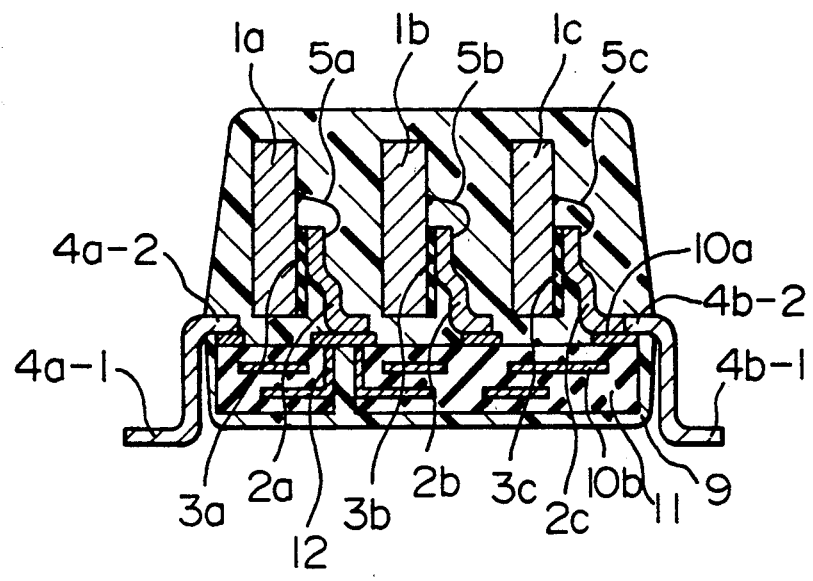

FIG. 5 shows a sectional view of a plastic-molded-type semiconductor device according to the fourth embodiment.

In this embodiment, the arrangement of semiconductor chips, first lead frame, insulating film and wires is the same as in the first embodiment, while an inside wiring board 9 composed of an insulatig material 11 and wiring patterns 10a and 10b is arranged horizontally inside of the package unit, and the chips are electrically connected with the outside leads by connecting the wiring pattern 10a with the first lead frames 2a, 2b and 2c, and with the second lead frames 4a-2, 4b-2 continuous to the outside leads 4a-1, 4b-1, respectively.

The inside wiring board 9 includes an inside wiring pattern 10b in addition to the surface wiring board 10a, thereby forming a multi-layer substrate, and the layers are electrically connected with each other through usual through holes 12 in the same manner as in an usual printed circuit board.

In this embodiment, since a multi-layer inside wiring board is used, the degree of freedom of the electrical connection inside of the package unit is sharply increased. The material of the inside wiring board 9 may be the same as that used in usual printed circuit boards, for example, such as ceramic or glass-epoxy substrate. For connecting the first and second leads with the inside wiring board, it is desired to use a welding process in view of the reliability of the semiconductor device, but the connection using soldering may be also used. It is possible to mount another components such as capacitors or resistances on the inside wiring board.

Figure 6:
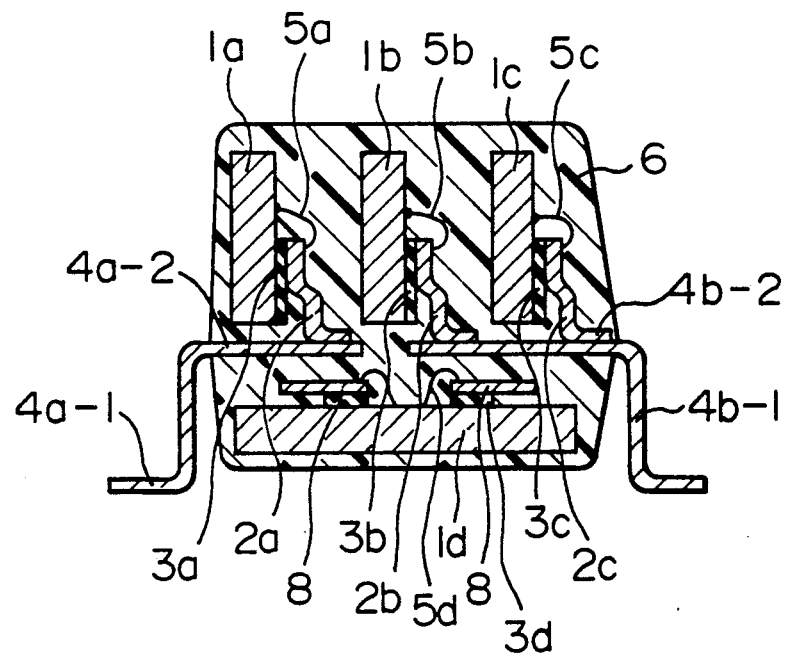

FIG. 6 is a sectional view of a plastic-molded-type semiconductor device according to the fifth embodiment.

In this embodiment, a horizontally arranged semiconductor chip 1d is sticked to a part 8 of the second lead frame with an insulating material 3d interposed therebetween, and the semiconductor chip 1d is electrically connected through wires 5d. A part 8 of the second lead frame is connected with another outside lead in another sectional plane in the same way as in the third embodiment shown in FIG. 4. By arranging a plastic-molded-type semiconductor device according to this embodiment, it becomes possible to mount one additional semiconductor chip in comparison with the first to fourth embodiments.

Furthermore, in the semiconductor chips the reverse surface of the circuit arranged surface thereof may be stuck to part 8 of the second lead frame through the insulating member. In another way, this reverse surface is stuck to a lower surface of the inside wiring board 9 according to the fourth embodiment and wiring pattern is provided on the lower surface of the inside wiring board 9, so that the wiring pattern may be electrically connected with the electrode of the semiconductor chip 1d.

Figure 7:
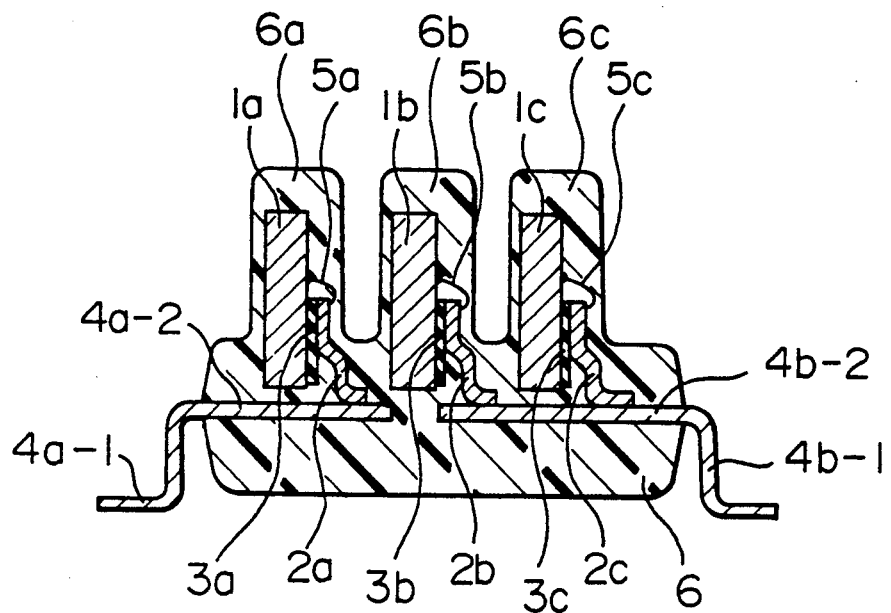

FIG. 7 is a sectional view of a plastic-molded-type semiconductor device according to the sixth embodiment.

In this embodiment, there are provided projections 6a, 6b, 6c made of molding resin 6, inside of which semiconductor chips 1a, 1b, 1c are arranged, respectively. The structures other than these structures are the same as in the first embodiment. The resin projections 6a, 6b, 6c have a function of efficiently radiating the heat generated in the semiconductor chips towards the outside as enhancing the efficiency of the heat radiating fins, thereby remarkably decreasing the thermal resistance of the semiconductor device. In this arrangement, the resin thickness of the projection is desired to be made as thin as possible for decreasing the thermal resistance. Further, in the embodiments 1 to 5, it is to say nothing that the same effect as in this embodiment is also obtained by arranging each of semiconductor chips in each of the projections.

In the seventh embodiment of the present invention, the semiconductor chips mounted on the plastic-molded-type semiconductor device according to the first-6th embodiments are limited to memory chips. In general, when a plurality of semiconductor chips are encased in a package, the kind and the number of the semiconductor chips to be mounted are limited, because the inside wiring becomes complicated and the number of the outside leads is increased. On the other hand, in case of memory devices, even if the number of semiconductor chips to be mounted is increased, it is not required to increase the number of the outside leads, because portions of wirings are dealed with by means of internal wiring. Further, this internal wiring is not so complicated. A device which can obtain a great merit by encasing a plurality of semiconductor chips in a package is a semiconductor memory device. Further, in this embodiment, the chips to be mounted may be composed of two kinds of chips, namely, of memory chips and semiconductor chips for controlling these memory chips. If the fourth embodiment is applied thereto, capacitors required in the memory devices may be built-in.

Figure 8:
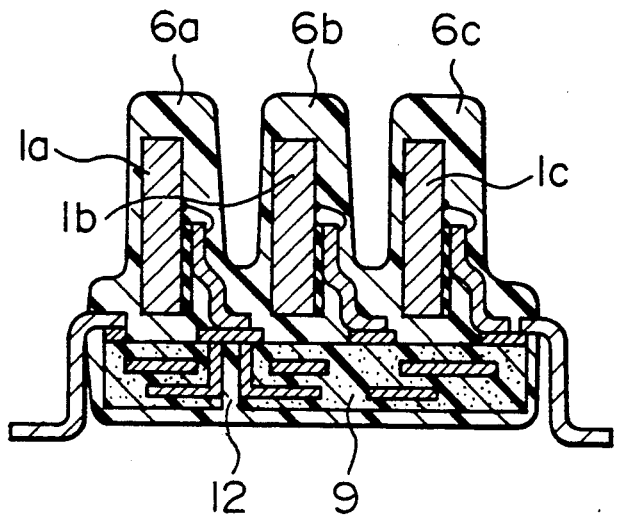
Figure 9:
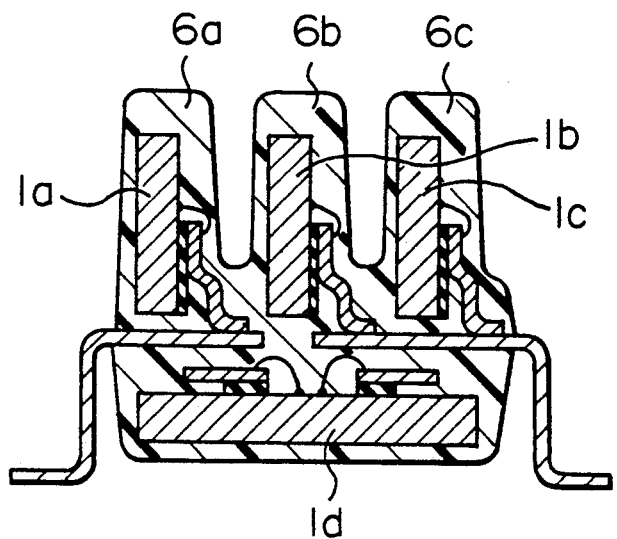

FIG. 8 shows an eighth embodiment. This embodiment includes heat radiating fins formed by plastic-molded projections, and the other structures are the same as those of the fourth embodiment which uses an inside wiring board 9. Further, a ninth embodiment is shown in FIG. 9. This example is a form in which heat radiating fins formed by plastic-molded projections are also provided, and the other structures of this embodiment are the same as those of the fifth embodiment which uses different semicondutor chips 1d.

Figure 10:
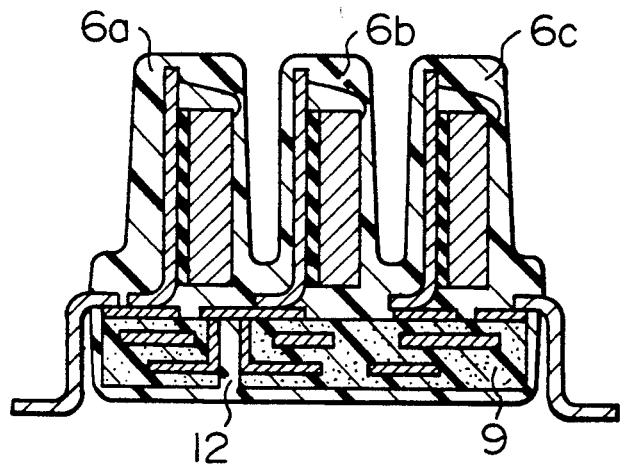
Figure 11:
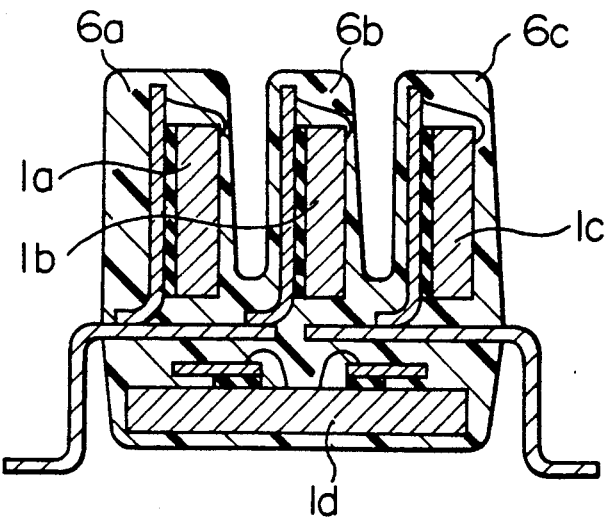

FIG. 10 shows a tenth embodiment, and FIG. 11 an eleventh embodiment, respectively. In both of these embodiments, the lead connection of lead-on-chip type, which each is used in the eighth and ninth embodiments, is replaced by chip-on-lead type connection.

Figure 12:
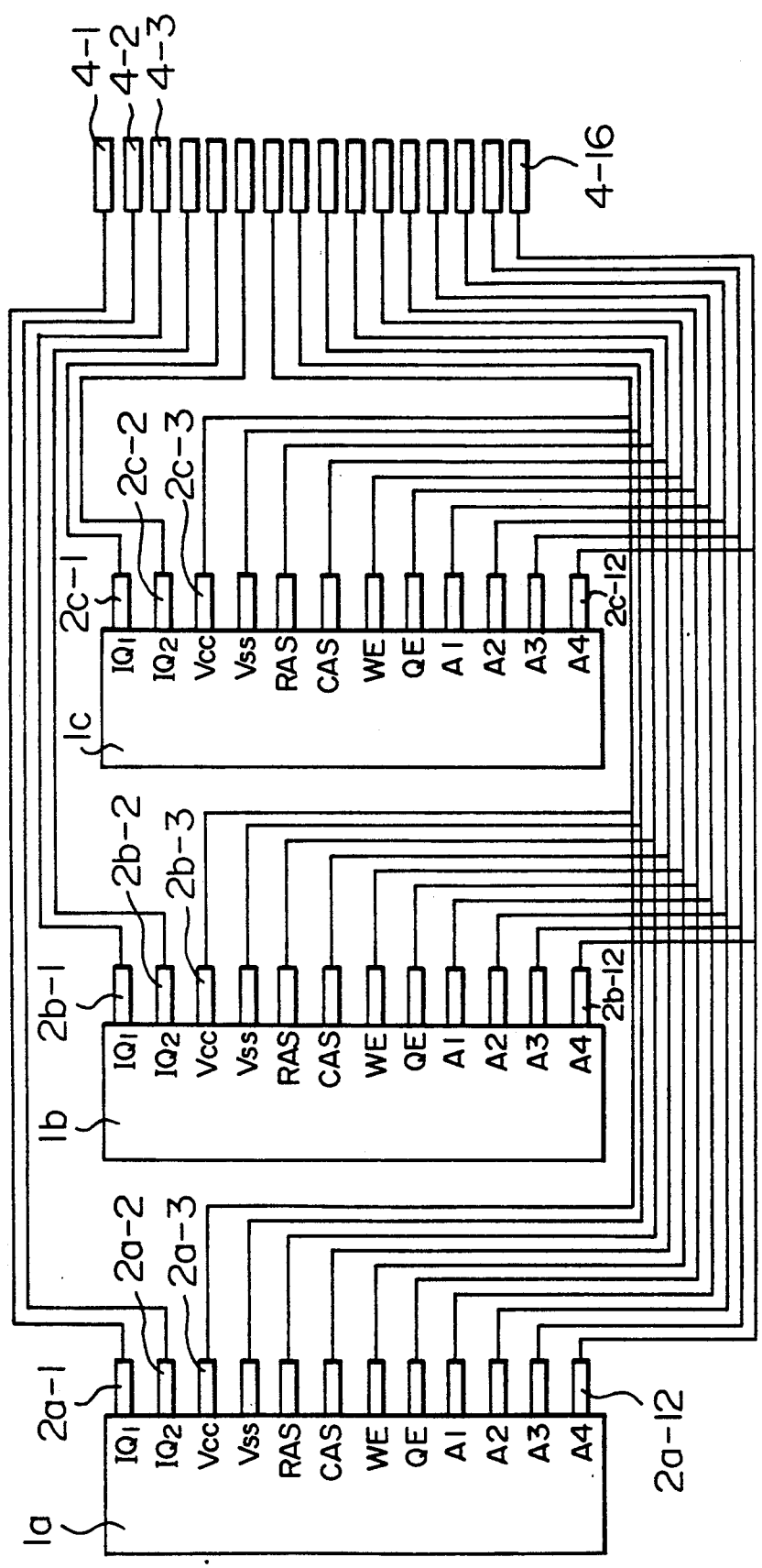
FIG. 12 is a wiring diagram of the twelfth embodiment.

FIG. 12 shows a twelfth embodiment. In this embodiment, three dynamic random access memory (DRAM) chips are used as semiconductor chips. FIG. 12 shows electrical wirings between the first lead frame group and the second lead frame group, and the concrete arrangement is similar to that of the first embodiment, for example.

In FIG. 12, numerals $IO_1$, $IO_2$ denote input, output terminals, VCC denotes an electric power source voltage terminal, VSS denotes a standard voltage terminal, RAS denotes a row address strobe signal terminal, CAS denotes a column address strobe signal terminal, and WE denotes a write enable terminal. The terminals AS, WE, OE, A1 to A4 each can be made common, while the terminals $IO_1$, $IO_2$ are required to be individual. In consequence, by wiring the first lead frame group 2a-1~2a-12, 2b-1~2b-12, and 2c-1~2c-12, with the second lead frames group 4-1~4-16, there can be obtained a package unit having a memory capacity increased by three times. Further, although, in this embodiment, there are two input and output terminals and four address terminals, this arrangement is only one example, but the number of these terminals is frequently greather than the above in many cases.

Since a plastic-molded-type semiconductor device according to the present invention has an arrangement mentioned above, semiconductor chips of arbitrary size and arbitrary number can be piled one upon another in a package unit, the degree of integration of the semiconductor device is remarkably improved. This arrangement is particularly effective for a semiconductor device which uses memory chips.

What is claimed is:

1. A plastic-molded-type semiconductor device including a plurality of semiconductor chips, lead frames having outside lead groups and inside lead groups, and connecting members for electrically connecting said semiconductor chips with said lead frames, a part of said lead frames, said semiconductor chips and said electrical connecting members being plastic-molded in a package unit, wherein
said plurality of semiconductor chips are arranged in directions intersecting a substrate for mounting the semiconductor device thereon; a first lead frame group is connected with circuit formed surfaces of said plurality of semiconductor chips by using electrically insulating material interposed therebetween; said first lead frame group is electrically connected with said semiconductor chips; and said first lead frame group is connected with a second lead frame group continuing from said outside lead group.

2. A plastic-molded-type semiconductor device including a plurality of semiconductor chips, lead frames having outside lead groups and inside lead groups, and connecting members for electrically connecting said semiconductor chips with said lead frames, a part of said lead frames, said semiconductor chips and said electrical connecting members being plastic-molded in a package unit, wherein said plurality of semiconductor chips are arranged in directions intersecting a substrate for mounting the semiconductor device thereon; a first lead frame group is connected with reverse surfaces of circuit formed surfaces of said plurality of semiconductor chips by using electrically insulating material interposed therebetween; said first lead frame group is electrically connected with said semiconductor chips; and said first lead frame group is connected with a second lead frame group continuing from said outside lead group.

3. A plastic-molded-type semiconductor device including a plurality of semiconductor chips, lead frames having outside lead groups and inside lead groups, and connecting members for electrically connecting said semiconductor chips with said lead frames, a part of said lead frames, said semiconductor chips and said electrical connecting members being plastic-molded in a package unit, wherein said plurality of semiconductor chips are arranged in directions intersecting a substrate for mounting the semiconductor device thereon; a first lead frame group is connected with the circuit formed surfaces of said plurality of semiconductor chips by using electrically insulating material interposed therebetween; an inside wiring board is arranged inside of said package unit; and said first lead frame group and a second lead frame group continuing from said outside leads are electrically connected with said substrate.

4. A plastic-molded-type semiconductor device including a plurality of semiconductor chips, lead frames having outside lead groups and inside lead groups, and connecting members for electrically connecting said semiconductor chips with said lead frames, a part of said lead frames, said semiconductor chips and said electrical connecting members being plastic-molded in a package unit, wherein said plurality of semiconductor chips are arranged in directions intersecting a substrate for mounting the semiconductor device thereon; a first lead frame group is connected with reverse surfaces of circuit formed surfaces of said plurality of semiconductor chips by using electrically insulating material interposed therebetween; an inside wiring board is arranged in said package unit; and said first lead frame group and a second lead frame group continuing from said outside leads are elctrically connected with said substrate.

5. The plastic-molded-type semiconductor device according to claim 3 or 4, wherein said inside wiring board is arranged substantially in parallel to the substrate for mounting the semiconductor device thereon, and has electrically insulating materials and wiring patterns.

6. The plastic-molded-type semiconductor device according to claim 5, wherein one additional semiconductor chip is arranged substantially in parallel to the substrate for mounting the semiconductor device thereon, and is electrically connected with said second lead frame group continuing from said outside lead group.

7. The plastic-molded type semiconductor device according to claim 5, wherein said second lead frame group has a lead frame group united with outside leads and lead frame group connected therewith.

8. The plastic-molded-type semiconductor device according to claim 5, wherein said plurality of semiconductor chips are arranged substantially perpendicular to said substrate for mounting the semiconductor device thereon.

9. The plastic-molded-type semiconductor device according to 5, wherein said plurality of semiconductor chips are arranged substantially perpendicular to a principal plane of said second lead frame group.

10. The plastic-molded-type semiconductor device according to claim 5, wherein all of said plurality of semiconductor chips are memory chips.

11. The plastic-molded-type semiconductor device according to claim 5, wherein said plurality of semiconductor chips are memory chips and chips for controlling the memory chips.

12. The plastic-molded-type semiconductor device according to claim 5, wherein said first lead frame group is electrically connected with said semiconductor chips by using wires.

13. The plastic-molded-type semiconductor device according to claim 5, wherein projections made of molding resin are provided on a package surface opposite to other package surface facing to the substrate for mounting the semiconductor device thereon, and at least a part of said plurality of semiconductor chips is accommodated in said projections.

14. The plastic-molded-type semiconductor device according to one of claims 1 to 4, wherein one additional semiconductor chip is arranged substantially in parallel to the substrate for mounting the semiconductor device thereon, and is electrically connected with said second lead frame group continuing from said outside lead group.

15. The plastic-molded-type semiconductor device according to claim 14, wherein said plurality of semiconductor chips are arranged substantially perpendicular to said substrate for mounting the semiconductor device thereon.

16. The plastic-molded-type semiconductor device according to claim 14, wherein said plurality of semiconductor chips are arranged substantially perpendicular to a principal plane of said second lead frame group.

17. The plastic-molded-type semiconductor device according to claim 14, wherein all of said plurality of semiconductor chips are memory chips.

18. The plastic-molded-type semiconductor device according to claim 14, wherein said plurality of semiconductor chips are memory chips and chips for controlling the memory chips.

19. The plastic-molded-type semiconductor device according to claim 14, wherein said first lead frame group is electrically connected with said semiconductor chips by using wires.

20. The plastic-molded-type semiconductor device according to claim 14 wherein projections made of molding resin are provided on a package surface opposite to other package surface facing to the substrate for mounting the semiconductor device thereon, and at least a part of said plurality of semiconductor chips is accommodated in said projections.

21. The plastic-molded-type semiconductor device according to one of claims 1 to 4, wherein said second lead frame group has a lead frame group united with outside leads and lead frame group connected therewith.

22. The plastic-molded-type semiconductor device according to claim 21, wherein said plurality of semiconductor chips are arranged substantially perpendicular to said substrate for mounting the semiconductor device thereon.

23. The plastic-molded-type semiconductor device according to claim 21, wherein said plurality of semiconductor chips are arranged substantially perpendicular to a principal plane of said second lead frame group.

24. The plastic-molded-type semiconductor device according to claim 21, wherein all of said plurality of semiconductor chips are memory chips.

25. The plastic-molded-type semiconductor device according to claim 21, wherein said plurality of semiconductor chips are memory chips and chips for controlling the memory chips.

26. The plastic-molded-type semiconductor device according to claim 21, wherein said first lead frame group is electrically connected with said semiconductor chips by using wires.

27. The plastic-molded-type semiconductor device according to claim 21, wherein projections made of molding resin are provided on a package surface opposite to other package surface facing to the substrate for mounting the semiconductor device thereon, and at least a part of said plurality of semiconductor chips is accommodated in said projections.

28. The plastic-molded-type semiconductor device according to one of claims 1 to 4, wherein said plurality of semiconductor chips are arranged substantially perpendicular to said substrate for mounting the semiconductor device thereon.

29. The plastic-molded-type semiconductor device according to claim 28, wherein all of said plurality of semiconductor chips are memory chips.

30. The plastic-molded-type semiconductor device according to claim 28, wherein said plurality of semiconductor chips are memory chips and chips for controlling the memory chips.

31. The plastic-molded-type semiconductor device according to claim 28, wherein said first lead frame group is electrically connected with said semiconductor chips by using wires.

32. The plastic-molded-type semiconductor device according to claim 28, wherein projections made of molding resin are provided on a package surface opposite to other package surface facing to the substrate for mounting the semiconductor device thereon, and at least a part of said plurality of semiconductor chips is accommodated in said projections.

33. The plastic-molded-type semiconductor device according to one of claims 1 to 4, wherein said plurality of semiconductor chips are arranged substantially perpendicular to a principal plane of said second lead frame group.

34. The plastic-molded-type semiconductor device according to claim 33, wherein all of said plurality of semiconductor chips are memory chips.

35. The plastic-molded-type semiconductor device according to claim 33, wherein said plurality of semiconductor chips are memory chips and chips for controlling the memory chips.

36. The plastic-molded-type semiconductor device according to claim 33, wherein said first lead frame group is electrically connected with said semiconductor chips by using wires.

37. The plastic-molded-type semiconductor device according to claim 33, wherein projections made of molding resin are provided on a package surface opposite to other package surface facing to the substrate for mounting the semiconductor device thereon, and at least a part of said plurality of semiconductor chips is accommodated in said projections.

38. The plastic-molded-type semiconductor device according to one of claims 1 to 4, wherein all of said plurality of semiconductor chips are memory chips.

39. The plastic-molded-type semiconductor device according to claim 38, wherein projections made of molding resin are provided on a package surface opposite to other package surface facing to the substrate for mounting the semiconductor device thereon, and at least a part of said plurality of semiconductor chips is accommodated in said projections.

40. The plastic-molded-type semiconductor device according to one of claims 1 to 4, wherein said plurality of semiconductor chips are memory chips and chips for controlling the memory chips.

41. The plastic-molded-type semiconductor device according to claim 40, wherein projections made of molding resin are provided on a package surface opposite to other package surface facing to the substrate for mounting the semiconductor device thereon, and at least a part of said plurality of semiconductor chips is accommodated in said projections.

42. The plastic-molded-type semiconductor device according to one of claims 1 to 4, wherein said first lead frame group is electrically connected with said semiconductor chips by using wires.

43. The plastic-molded-type semiconductor device according to claim 42, wherein projections made of molding resin are provided on a package surface opposite to other package surface facing to the substrate for mounting the semiconductor device thereon, and at least a part of said plurality of semiconductor chips is accommodated in said projections.

44. The plastic-molded-type semiconductor device according to one of claims 1 to 4, wherein projections made of molding resin are provided on a package surface opposite to other package surface facing to the substrate for mounting the semiconductor device thereon, and at least a part of said plurality of semiconductor chips is accommodated in said projections.

45. The plastic-molded-type semiconductor device according to claim 44, wherein said projections are plural, and a part of said semiconductor chip is accommodated in each of said projections.

46. A method of producing a plastic-molded-type semiconductor device, comprising the steps of
sticking an end of a first lead frame to a semiconductor chip with an insulating film interposed therebetween,
wire-bonding a first lead with said semiconductor chip,
electrically connecting said first lead with a second lead continuing from an outside lead and fixing them,
arranging the semiconductor chips substantially perpendicular to a substrate at the time of connecting the first lead, and
plastic-molding said constituent members together after arranging the semiconductor chip.

47. The method of producing a plastic-molded-type semiconductor device according to claim 46, wherein said second lead is an inside wiring board.

48. The method of producing a plastic-molded-type semiconductor device according to claim 46, wherein said second lead is an additional semiconductor chip.

* * * * *